US006363268B1

(12) United States Patent
Schuchardt et al.

(10) Patent No.: US 6,363,268 B1
(45) Date of Patent: Mar. 26, 2002

(54) SUPERCONDUCTING ULTRABROADBAND ANTENNA

(75) Inventors: James M. Schuchardt, Gwynedd Valley; Daniel J. Martin, Harleysville, both of PA (US)

(73) Assignee: BAE Systems Aerospace Electronics Inc., Lansdale, PA (US)

( * ) Notice: Subject to any disclaimer, the term of this patent is extended or adjusted under 35 U.S.C. 154(b) by 0 days.

(21) Appl. No.: 08/288,418

(22) Filed: Aug. 10, 1994

(51) Int. Cl.[7] .............................................. H01L 39/12

(52) U.S. Cl. ....................... 505/201; 505/202; 505/210; 342/368

(58) Field of Search ................................ 505/201, 202, 505/210; 342/368

(56) References Cited

U.S. PATENT DOCUMENTS 4,918,049 A * 4/1990 Cohn et al. ................. 505/201
5,105,200 A * 4/1992 Koepf ................. 343/700 MS
5,159,347 A * 10/1992 Osterwalder ................ 343/787
5,215,959 A * 6/1993 Van Duzer .................. 505/201
5,258,626 A * 11/1993 Suzuki et al. ................. 257/39
5,397,769 A * 3/1995 Higaki et al. ............... 505/210

* cited by examiner

*Primary Examiner*—Gregory C. Issing
(74) *Attorney, Agent, or Firm*—Drinker Biddle & Reath LLP

(57) ABSTRACT

A transmission line antenna assembly having a substantially continuous bandwidth from the microwave region of the electromagnetic spectrum to the VHF region of the spectrum. The antenna assembly includes at least one balanced transmission line antenna element of high-temperature superconductor material supported by a substrate, an antenna cavity supporting the substrate and containing a thermally-conductive electromagnetic-energy-absorbing material therein, and a cryogenic cooler for cooling the antenna element to a temperature at which it exhibits superconductivity.

20 Claims, 3 Drawing Sheets

FIG.2
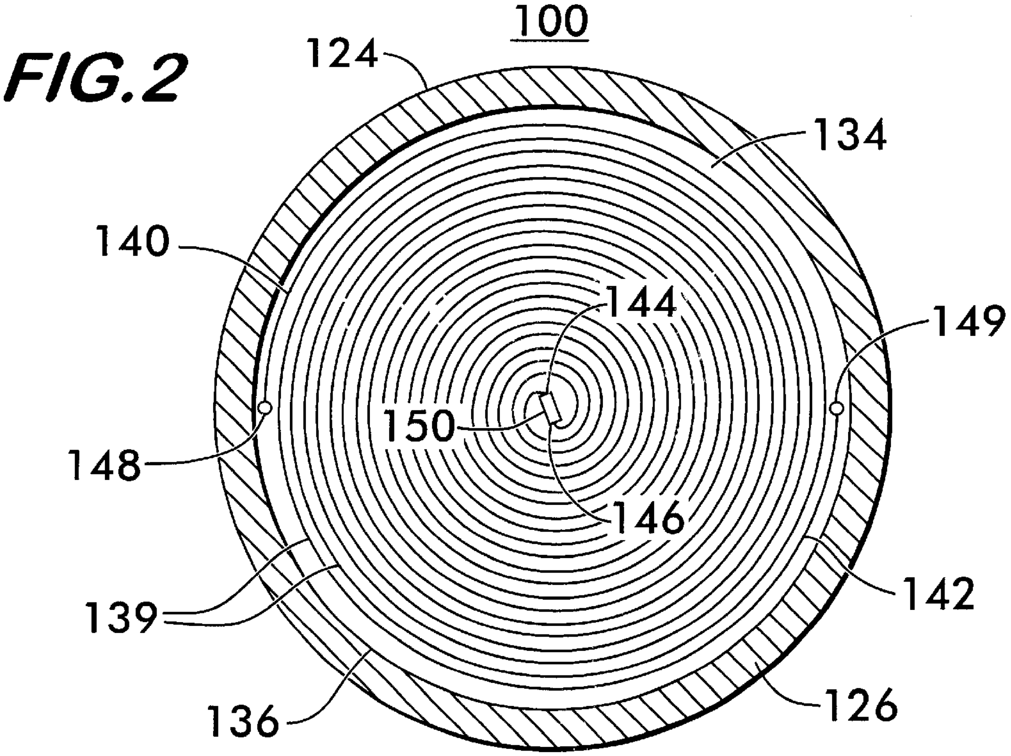
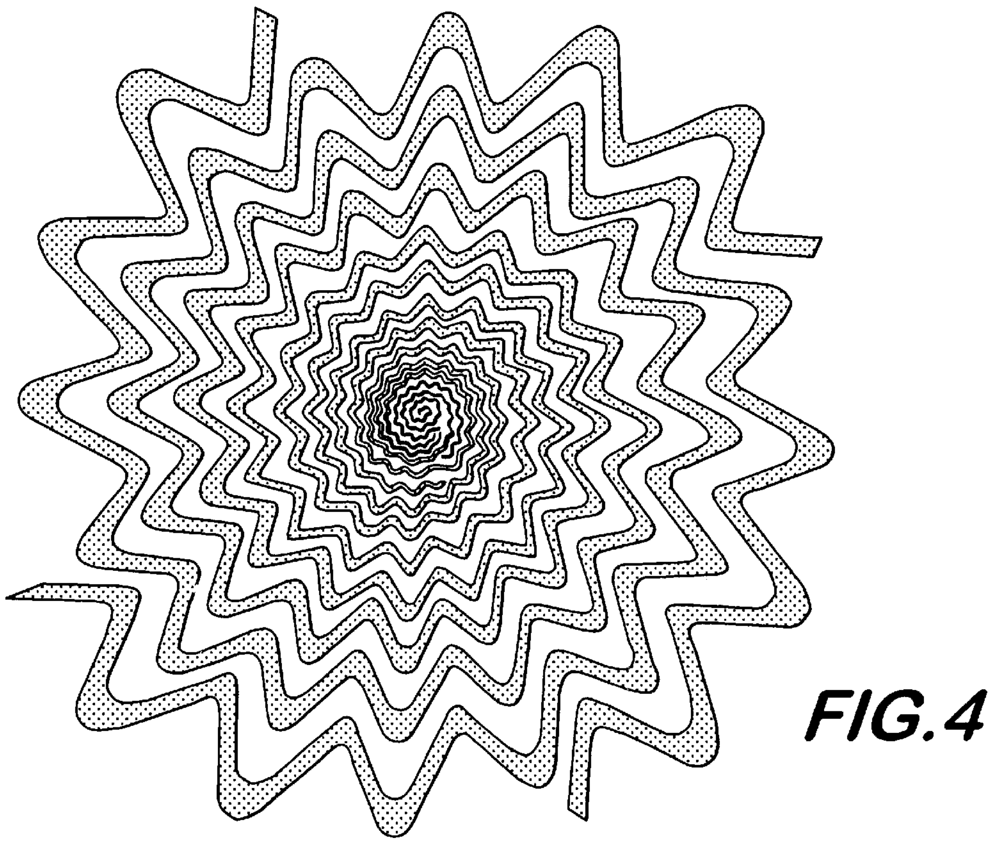
FIG.4

SUPERCONDUCTING ULTRABROADBAND ANTENNA

FIELD OF THE INVENTION

The present invention relates to superconducting ultra-broadband antennas generally and, in particular, to a high-temperature superconductor, broadband self-limiting spiral antenna with a controllable signature. While the present invention will be discussed with reference to spiral antennas, it should be understood that the invention is applicable to other forms of transmission line antennas which are not, strictly speaking, spirals, such as log periodic, sinuous, deformed spiral, and ambidextrous antennas.

BACKGROUND OF THE INVENTION

Broadband antennas are widely used in many contexts, including communications, as radar warning receivers, electronic support measures, and other civil and military applications. In those cases where a broad bandwidth is desired, it is usually necessary to sacrifice some other aspect of antenna performance in order to obtain the desired bandwidth. In some cases, it is necessary to make the antenna larger in order to increase bandwidth. In other cases, increased bandwidth is obtained at the expense of the radiation pattern of the antenna. Neither of these tradeoffs is especially desirable. Where it is desired to mount the antenna on an aircraft or other mobile platform, for example, increased size exacts a penalty in added weight and reduction in space available for other equipment. Degradation of the antenna's radiation pattern can severely compromise antenna performance. Antenna designers are continually seeking ways to increase antenna bandwidth without sacrificing antenna performance and without incurring increases in size and weight.

Much attention has been devoted to improving the bandwidth of transmission line antennas, particularly to extending the bandwidth of spiral transmission line antennas into the VHF/UHF/SHF bands. Prior attempts have primarily focused on improving low-frequency response by increasing the size of the antenna. Increasing the diameter of the spiral, and concomitantly the length of the arms of the spiral, provides frequency scaling that always results in lower gain at the equivalent scaled Lower) frequency. As the length of the spiral arms (sometimes also called the "windings") is increased, so is their resistance. In many cases, the efficiency of the antenna will become quite low because of losses due to the increased resistance. Thus, a wideband antenna will have lower efficiency at the lower end of the band, since attenuation from loss resistance is greater in that portion of the band. This is because there is a longer distance from the feed points to the "one-wavelength" diameter radiating region of the spiral. The loss per unit length in the windings varies approximately as $f^{1/2}$, but the length of windings which is effectively used to excite the "one wavelength" diameter radiating region varies as $1/f^2$. As a result, the loss variation due to this effect alone is an inverse function of frequency approximately equal to $1/f^{3/2}$.

The inventors have found that reducing conductor resistance by several orders of magnitude will change the conductor loss effect from a $1/f^{3/2}$ relationship (high loss at low frequencies) back toward a $f^{1/2}$ relationship (low loss at low frequencies). The conductor resistance can be decreased dramatically by forming the spiral windings from a high-temperature superconducting (HTSC) material, i.e., materials which exhibit superconductivity at temperatures on the order of 77° K. At 1.0 GHz, HTSC materials are expected to offer surface resistance values as low as 1 $\mu\Omega$ per square, which is several orders of magnitude below cryogenically-cooled copper at 77° K.

The inventors are not aware of any previous attempts to improve antenna bandwidth using HTSC or other cryogenic conductors. While A. Septier and N. T. Viet have suggested using low temperature superconductors (which exhibit superconductivity while immersed in liquid helium at about 1.5° K.) to improve antenna Q, it is noted that the result of such an improvement is a very narrowband antenna. See, A. Septier and N. T. Viet, "Microwave applications of superconducting materials," *J. of Physics E.,* vol. 10, pp. 1193–1207 (1977). U.S. Statutory Invention Registration H653 discloses a superconducting superdirective antenna array using high temperature superconductors, but it discloses only a very narrow bandwidth.

There is a need for an ultrabroadband transmission line antenna (i.e., one having a low Q), which covers frequencies from the microwave region down to the VHF region of the spectrum. The present invention fulfills that need.

SUMMARY OF THE INVENTION

The present invention is broadly directed to a transmission line antenna assembly having a substantially continuous bandwidth from the microwave region of the electromagnetic spectrum to the VHF region of the spectrum. The antenna assembly comprises at least one balanced transmission line antenna element of high-temperature superconductor material (HTSC) supported by a substrate, an antenna cavity supporting the substrate and containing a thermally-conductive electromagnetic-energy-absorbing material therein, and a cryogenic cooler for cooling the antenna element to a temperature at which it exhibits superconductivity. Preferably, the substrate has a crystalline lattice compatible with that of the HTSC and is thermally matched to it.

More particularly, the present invention is directed to an antenna assembly having a plurality of antenna elements of high-temperature superconductor material supported by a substrate in which each element forms a spiral. Each element has a first end proximate the first end of each other element. The elements are interwound and define a concentric multi-arm spiral. The antenna assembly also comprises an antenna cavity supporting the substrate and containing a thermally-conductive electromagnetic-energy-absorbing material therein, and a cryogenic cooler for cooling the antenna elements to a temperature at which they exhibit superconductivity.

DESCRIPTION OF THE DRAWINGS

For the purpose of illustrating the invention, there is shown in the drawings a form which is presently preferred; it being understood, however, that this invention is not limited to the precise arrangements and instrumentalities shown.

FIG. 2 is a top plan view, in simplified form, of a spiral transmission line antenna.

FIG. 4 is a top plan view, in simplified form, of a wavy spiral transmission line antenna.

DESCRIPTION OF THE INVENTION

Figure 1:
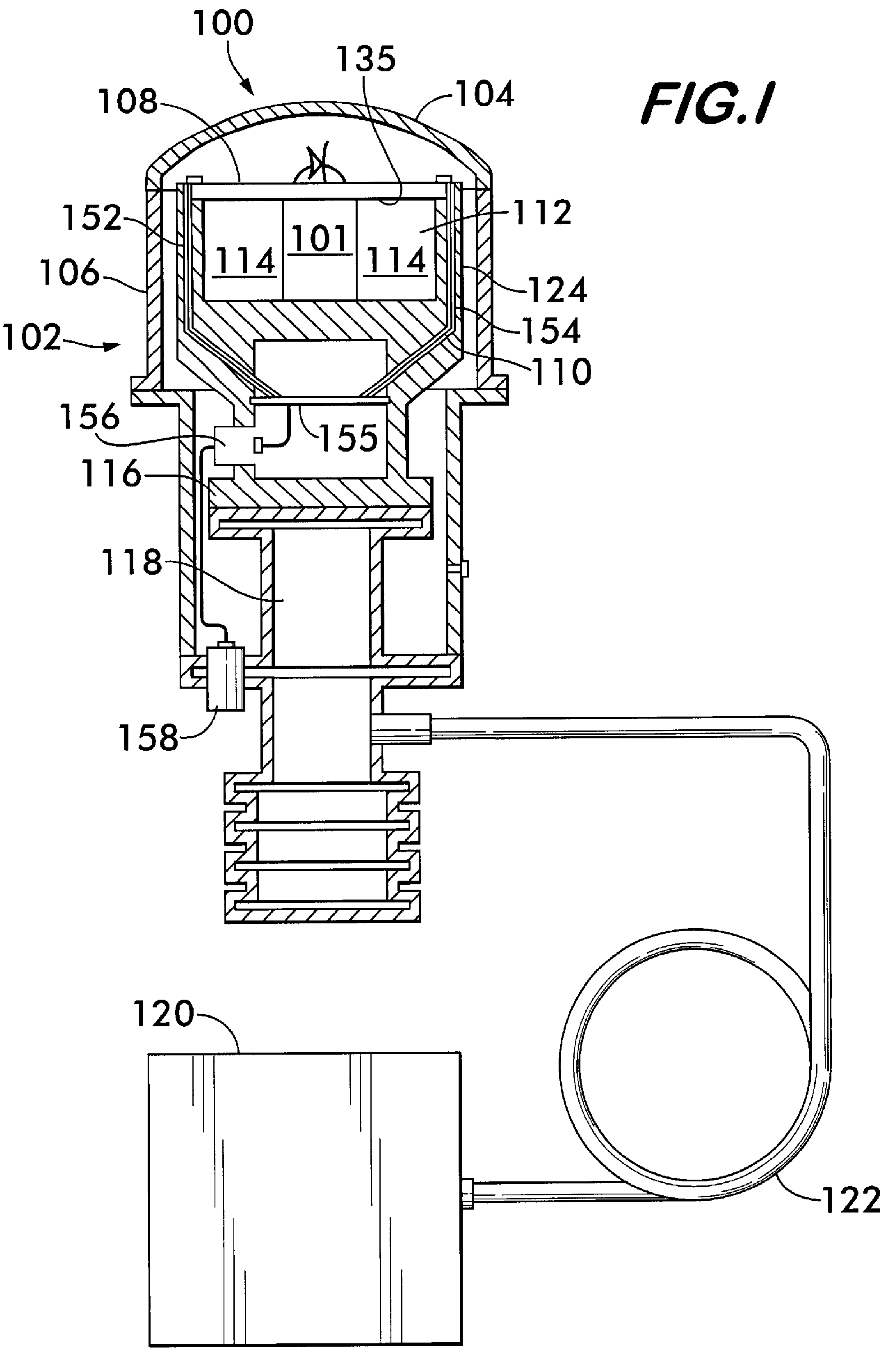
FIG. 1 is a simplified schematic illustration of a system incorporating an antenna according to the invention, illustrating one form of mechanical support for the antenna and one way of cryogenically cooling the antenna.

Referring now to the drawings, wherein like numerals indicate like elements, there is shown a typical spiral transmission line antenna device 100. Device 100 comprises a housing 102, which includes a radome 104 and a thermal shield 106. Housing 102 is substantially cylindrical in shape. Device 100 further comprises a transmission line antenna 108, which is supported by a substantially cylindrical body 124. Body 124 defines channels through which pass video feed lines 110 or a balun 101 to antenna 108, depending upon which feed method is used. Body 124 is also substantially hollow, and defines a cavity 112 therein which is optionally, and not necessarily, filled with radiation absorbing material 114 as is known in the art, such as treated silicon carbide. Any suitable radiation absorbing material may be used, provided that the material has both good radiation absorption ability and high thermal conductivity, since the antenna device 100 must be cryogenically cooled to approximately 77° K.

Body 124 extends below cavity 112 to form a base plate 116. Base plate 116 is mounted in intimate thermal contact with cryostat 118. Cryostat 118 is cooled in known manner by a compressor/heat exchanger 120 via gas line 122.

Transmission line antenna 108, illustrated as a two-arm spiral antenna, is formed on substrate or plate 134, which is made of magnesium oxide (MgO), lanthanum aluminate ($LaAlO_3$), sapphire, zirconia (YSZ) or any material sufficient to support high temperature superconductors. These materials have a high dielectric constant ($\in$>10). The plate 134 has a circular periphery 136 and closes the top of cavity 112 within body 124 and is secured thereto to seal the cavity 112.

The top flat surface of the plate 134 supports a pair of antenna elements 139, respectively comprising spirally interwound conductive windings 140, 142 with respective proximate ends 144, 146 at the center of the plate 134 and respective distal ends 148, 149 close to the periphery 136 of plate 134. The windings 140 and 142 are made of high-temperature superconducting (HTSC) material such as yttrium barium copper oxide (YBCO), or thallium barium calcium copper oxide TBCCO), HTSC mercury compounds or the like. Of course, any suitable high temperature superconductor can be used without departing from the invention. The proximal ends 144, 146 are angularly disposed from each other by about 180° relative to the center of the plate 134, as are the distal ends 148, 149 at the periphery 136 of plate 134.

In practice, it is not vital that the antenna elements 139 be formed of HTSC material on a dielectric substrate. As those skilled in the art will appreciate, the antenna elements could just as easily comprise spiral slots formed in an HTSC plate. Such a spiral slot equivalent antenna will function in the same manner as the antenna described immediately above. In addition, it is possible to fabricate the antenna by forming spiral slots in a metal plate and filling the slots with HTSC material. The resulting metal plate and HTSC element substructure is then mounted to plate 134.

Plate 134 is hermetically sealed to wall 126 of body 124, and the entire structure is then placed in housing 102 and covered by radome 104.

Because the material from which plate 134 is preferably fabricated has a high dielectric constant, it should be thin in order to minimize reflections from the boundary of the absorbing material 114. For structural support and heat spreading, a layer 135 of lower dielectric constant is provided between plate 134 and the absorbing material 114.

In order for the electric currents (not radiation) in the spiral windings 140 and 142 to propagate freely in the spiral circuit, the regions immediately above and below plate 134 need to be low-loss, i.e., have a low dielectric constant. The electric field lines of the electric currents in the spiral windings, called the "bound currents," project a small distance above and below plate 134. The distance the field lines of these bound currents project is determined, in part, by the dielectric constant and the thickness of plate 134. The higher the dielectric constant, the shorter the distance the field lines project. Hence, for HTSC spirals using substrates having high dielectric constants, such as $LaAlO_3$, the distance is quite small. This permits layer 135 of low dielectric constant material to be thin.

In practice, it is not necessary that layer 135 be a physically discrete layer of material. Although it can be, layer 135 can also be a region or portion of the cavity-filling absorbing material 114 that is not treated with an absorbing/resistive material. In other words, the absorbing material 114 in cavity 112 can have a resistive gradation, such that there is no resistive material (and hence a low loss region) near plate 134, with the resistance (and absorbing properties) increasing gradually toward the cavity bottom.

The antenna device may include a diode 150 positioned at the central region of plate 134 between the proximal ends 144 and 146 of the windings 140 and 142. If used, the diode 150 is electrically connected between proximal ends 144 and 146 by soldering or other suitable method. The distal end 148 of the winding 140 and the distal end 149 of the winding 142 are connected to video lines 152 and 154, which are connected through the RF front end/bias circuits 155 to connectors 156 and 158 to suitable external bias circuits (not shown).

The antenna device 100 may use a balun 101 connected to the central region of plate 134 between the proximal ends 144 and 146 of the windings 140 and 142. If used, the balun is electrically connected between proximal ends 144 and 146 by soldering or other suitable method. The unbalanced end of balun 101 is connected to the RF front end/bias circuit 155 through connectors 156 and 158 to suitable external bias circuits (not shown).

The suitable external bias circuits are not shown since they do not form any part of the invention and are well known to those skilled in the art.

Figure 3:
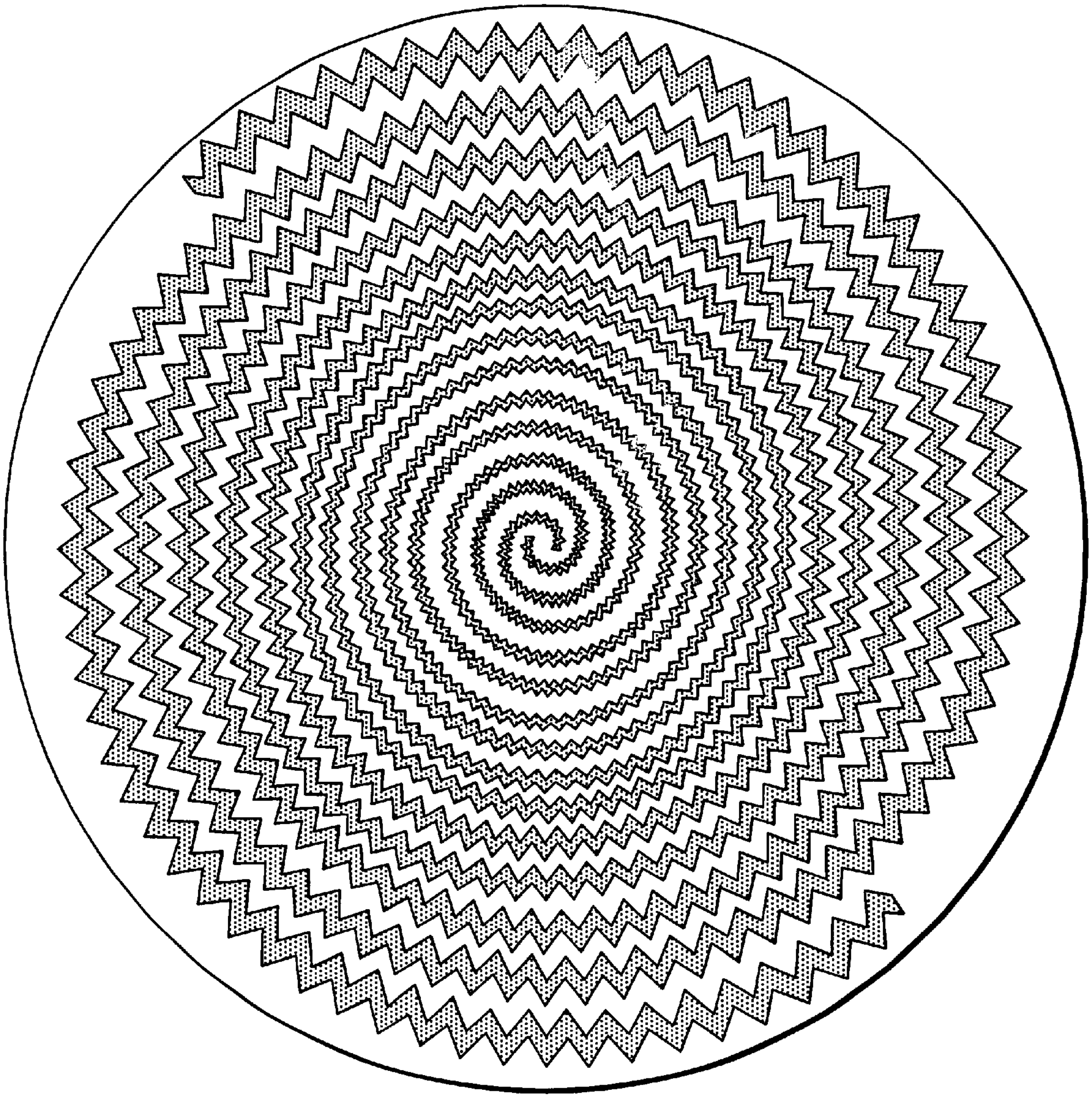
FIG. 3 is a top plan view, in simplified form, of a zig-zag spiral transmission line antenna.

With essentially zero ac (RF) losses in the spiral antenna, additional techniques can be applied to slow the wave propagation on the spiral circuit to enhance radiation performance at lower frequencies. Geometric "slow wave" circuits, such as the zig-zag spiral shown in FIG. 3 and the wavy spiral shown in FIG. 4, add significant spiral arm length. However, with the use of HTSC windings, as in the present invention, the added length does not add resistive losses that would reduce spiral gain at low frequencies.

Another performance feature made possible by the present invention is the ability to vary the antenna RF signature by varying the temperature (and therefore the conductive state) of the HTSC spiral. By varying the temperature of the spiral about the critical temperature, the spiral can be made to vary from superconducting to exhibiting normal conductivity. This can give the antenna a radiation pattern, or "signature," that is very difficult to detect.

The radiation signature relates to energy which emanates from the antenna, and includes two types of energy: (1) the RF scattered field from the antenna and its mounting host (e.g., an aircraft) caused by an external source (e.g., a search radar), and (2) the direct infrared/electro-optical/ultraviolet radiation (Planck blackbody radiation) that the HTSC antenna itself emits as influenced by its mounting host. Generally, it is desired to not increase the host and HTSC antenna signature above the so-called "slick and clean" condition of the host. In addressing these effects, there are at least two cases to consider: (1) the mounting host is generally metallic, and (2) the mounting host is generally nonmetallic.

For RF scattered signature control for a generally metallic mounting host, with the antenna not radiating, the HTSC needs to be in the conducting state so as to "blend in" with the host. That is, the antenna should appear to be metallic. This can be done by fabricating the antenna from a metallic plate and forming spiral slots in the plate. The spiral slots are filled with an HTSC to create windings 140 and 142. The resulting structure is mounted on plate 134. At temperatures below the critical temperature, the HTSC is conductive, and the antenna windings 140 and 142 and the metallic plate appear as a continuous piece of metal, thus blending in with the metallic host. At temperatures above the critical temperature, the windings 140 and 142 are nonconductive, whereas the surrounding metallic plate remains conductive, and the normal antenna "on" (radiating) condition occurs.

For a generally nonmetallic host, with the antenna not radiating, the antenna needs to be in a nonconductive state in order to blend in with the host. This can be accomplished by keeping the antenna device 100 as already described above the critical temperature. In this case, the windings 140 and 142 and plate 134 all appear to be nonmetallic. Alternatively, the antenna can be fabricated from a sheet of HTSC material with spiral slots formed therein, where the slots behave as the radiating element. Again, by keeping the temperature above the critical temperature, the sheet of HTSC material appears to be nonmetallic. When the temperature is lowered below the critical temperature, the windings become conductive and the antenna functions in the normal radiating mode.

The uniqueness of this type of signature control lies in the ability of the HTSC material to vary its conductivity as a function of temperature and to appear as a reasonably good dielectric material when in the "normal" state (above the critical temperature) and as a metallic conductor when in the superconducting state (below the critical temperature). Varying the conductivity of the HTSC is accomplished by changing the temperature of the HTSC well above or well below the critical temperature.

RF scattered signature control with the antenna radiating lies partly in conventional methods, which include shaping and physically blending into the host structure so as to minimize discontinuities that end to enhance the RF scattered field. However, HTSC materials offer a further dimension of control in that only portions of the antenna need be turned "on" (i.e., rendered conductive) to achieve improved blending into the host. For example, the central region of the spiral could be cooled so as to be superconducting, while the outer portion of the spiral is heated or otherwise allowed to rise in temperature to the critical temperature or even above.

A variation of signature control can be further realized by operating the antenna in a "degraded" mode near the HTSC critical temperature. At these temperatures, the HTSC windings could have higher resistivity than the superconducting state, but still offer useful antenna gain.

The quality of the direct IR/EO/UV radiation (Planck blackbody radiation) signature control, whether the antenna is radiating or not radiating, is affected by the coverings or material layers between the HTSC antenna and the "outside world" and their transparency in the IR/EO/UV bands. Assuming that these coverings or materials are IR/EO/UV transparent, then the external signature of the antenna is further affected by the HTSC element temperature and the differential emissivity with respect to the surrounding host and the background temperature at each specific band (IR, EO, and UV), which can be controlled by varying the temperature of the HTSC element.

The present invention may be embodied in other specific forms without departing from the spirit or essential attributes thereof and, accordingly, reference should be made to the appended claims, rather than to the foregoing specification, as indicating the scope of the invention.

What is claimed is:

1. A transmission line antenna assembly having a substantially continuous bandwidth from the microwave region of the electromagnetic spectrum to the VHF region of the spectrum, comprising at least one continuously-curved transmission line antenna radiating element of high-temperature superconductor material supported by a substrate, an antenna cavity supporting the substrate and containing a thermally-conductive electromagnetic-energy-absorbing material therein, and a cryogenic cooler for cooling the antenna radiating element to a temperature at which it exhibits superconductivity.

2. An antenna assembly as in claim 1, wherein the antenna radiating element comprises a multiarm spiral antenna.

3. An antenna assembly as in claim 1, wherein the antenna radiating element comprises a deformed spiral antenna.

4. An antenna assembly as in claim 1, wherein the antenna radiating element comprises a sinuous antenna.

5. An antenna assembly as in claim 1, wherein the antenna radiating element comprises a log periodic antenna.

6. An antenna assembly as in claim 1, wherein the antenna radiating element comprises an ambidextrous antenna.

7. An antenna assembly as in claim 1, further comprising said antenna element having a finite thickness and side walls, said side walls being bounded by metallic conductive material.

8. An antenna assembly as in claim 1, wherein said antenna element comprises a shaped slot formed in said superconductor material.

9. An antenna assembly as in claim 1, wherein the cryogenic cooler further comprises means for selectably cooling only a preselected portion of the antenna element to said temperature.

10. An antenna assembly having a substantially continuous bandwidth from the microwave region of the electromagnetic spectrum to the VHF region of the spectrum, comprising a plurality of antenna elements of high-temperature superconductor material supported by a substrate, each element forming a spiral having a first end proximate the first end of each other element, the elements being interwound and defining a concentric multi-arm spiral, an antenna cavity supporting the substrate and containing a thermally-conductive electromagnetic-energy-absorbing material therein, and a cryogenic cooler for cooling the antenna elements to a temperature at which they exhibit superconductivity.

11. An antenna assembly as in claim 10, wherein the plurality of antenna elements is two.

12. An antenna assembly as in claim 10, wherein the plurality of antenna elements is four.

13. An antenna assembly as in claim 10, wherein the superconductor material is selected from the group comprising thallium barium calcium copper oxide and yttrium barium copper oxide.

14. An antenna assembly as in claim 10, wherein the thermally-conductive electromagnetic-energy-absorbing material is treated silicon carbide.

15. An antenna assembly as in claim 10, further comprising a detector element bridging the first ends of the spirals.

16. An antenna assembly as in claim 10, wherein the cryogenic cooler further comprises means for selectably cooling only a preselected portion of the antenna element to said temperature.

17. An antenna assembly as in claim 10, further comprising said antenna element having a finite thickness and side walls, said side walls being bounded by metallic conductive material.

18. An antenna assembly as in claim 10, wherein said antenna element comprises a shaped slot formed in said superconductor material.

19. A method of varying the scattering signature of an antenna having at least one radiating element fabricated at least in part from high temperature superconducting material, comprising selectably varying the temperature of at least a portion of the radiating element of the antenna about the critical temperature of said superconducting material to selectably vary the resistance of said portion of said radiating element and hence the overall pattern of energy emanating from said antenna.

20. A method of varying the scattering signature of an antenna having at least one antenna radiating element fabricated at least in part from high temperature superconducting material, said antenna being mounted on a host platform, enable said antenna to blend in with the material of the host platform, comprising selectably varying the temperature of at least a portion of the antenna radiating element about the critical temperature of said superconducting material to cause said superconducting material to be superconducting when said host platform is substantially metallic and to be non-superconducting when said host platform is substantially nonmetallic.

* * * * *